United States Patent [19]
McKinney

[11] Patent Number: 6,097,232
[45] Date of Patent: Aug. 1, 2000

[54] TRACK-AND-HOLD SIGNAL GENERATOR HAVING A TIME-ALIGNED CLOCK

[75] Inventor: David J. McKinney, Beaverton, Oreg.

[73] Assignee: Tektronix, Inc., Beaverton, Oreg.

[21] Appl. No.: 08/987,340

[22] Filed: Dec. 9, 1997

[51] Int. Cl.⁷ ................................................. H03H 11/26
[52] U.S. Cl. .................... 327/270; 327/158; 331/DIG. 2
[58] Field of Search .................... 327/165, 172, 327/175, 263, 264, 285, 288, 295, 270, 281, 276, 156, 158, 163; 331/DIG. 2

[56] References Cited

U.S. PATENT DOCUMENTS

| | | | |
|---|---|---|---|
| 4,922,141 | 5/1990 | Lofgren | 307/595 |
| 5,144,525 | 9/1992 | Saxe | 365/45 |
| 5,231,320 | 7/1993 | Kase | 307/605 |
| 5,576,657 | 11/1996 | Frisch | 327/543 |
| 5,757,218 | 5/1998 | Blum | 327/175 |
| 5,939,950 | 8/1999 | Kamei | 327/175 |

*Primary Examiner*—Jung Ho Kim
*Attorney, Agent, or Firm*—Thomas F. Lenihan

[57] ABSTRACT

A logic analyzer uses a single tapped delay line and a single array of sampling cells for high speed digital signal acquisition, by controlling both edges of a substantially 50% duty cycle clock signal to drive a delay line buffer chain. The chain operates continuously; there being no need for interruptions for precharge intervals. Thus, the need for a second delay line buffer chain is eliminated.

4 Claims, 4 Drawing Sheets

TRACK-AND-HOLD SIGNAL GENERATOR HAVING A TIME-ALIGNED CLOCK

FIELD OF THE INVENTION

The subject invention generally concerns a generator for a track-and-hold signal, and specifically concerns the generation of multiple time-delayed versions of a track and hold signal.

BACKGROUND OF THE INVENTION

An analog signal high speed acquisition system using a tapped delay line to generate track-and-hold signals is known from U.S. Pat. No. 5,144,525 (Saxe, et al.) issued Sep. 1, 1992. The tapped delay line was realized as a cascade of buffer amplifiers each of which produced a delayed versions of a clock signal. That system recognized that excessive or insufficient buffer delay could cause improper operation, and provided a feedback circuit to ensure that the total delay of the tapped delay line was exactly equal to one clock cycle.

The above-mentioned '525 patent shows that the feedback (i.e., delay correction) signal is applied to a phase shifting circuit to shift one edge of each of the clock signals to a position in accordance with its proper timing relationship to the next signal of the delay line.

One embodiment of the teaching of the '525 patent is known from the TDS-500 series of oscilloscopes, manufactured by Tektronix, Inc. Wilsonville, Oreg. While that embodiment worked quite well, one limitation was encountered. Specifically, two delay lines and corresponding sampling cells were required, because following an active mode, the delay line chain requires a precharge interval before it can be utilized again. Thus, two delay lines operating in complementary timing were required to cover the acquisition period without "holes" due to precharge intervals. What is needed is a less complex system, dissipating a lower level of power, and requiring relatively less chip area.

SUMMARY OF THE INVENTION

A logic analyzer uses a single tapped delay line and a single array of sampling cells for high speed digital signal acquisition, by controlling both edges of a substantially 50% duty cycle clock signal to drive a delay line buffer chain. The chain operates continuously; there being no need for interruptions for precharge intervals. Thus, the need for a second delay line buffer chain is eliminated.

DETAILED DESCRIPTION OF THE EMBODIMENT

Figure 1:
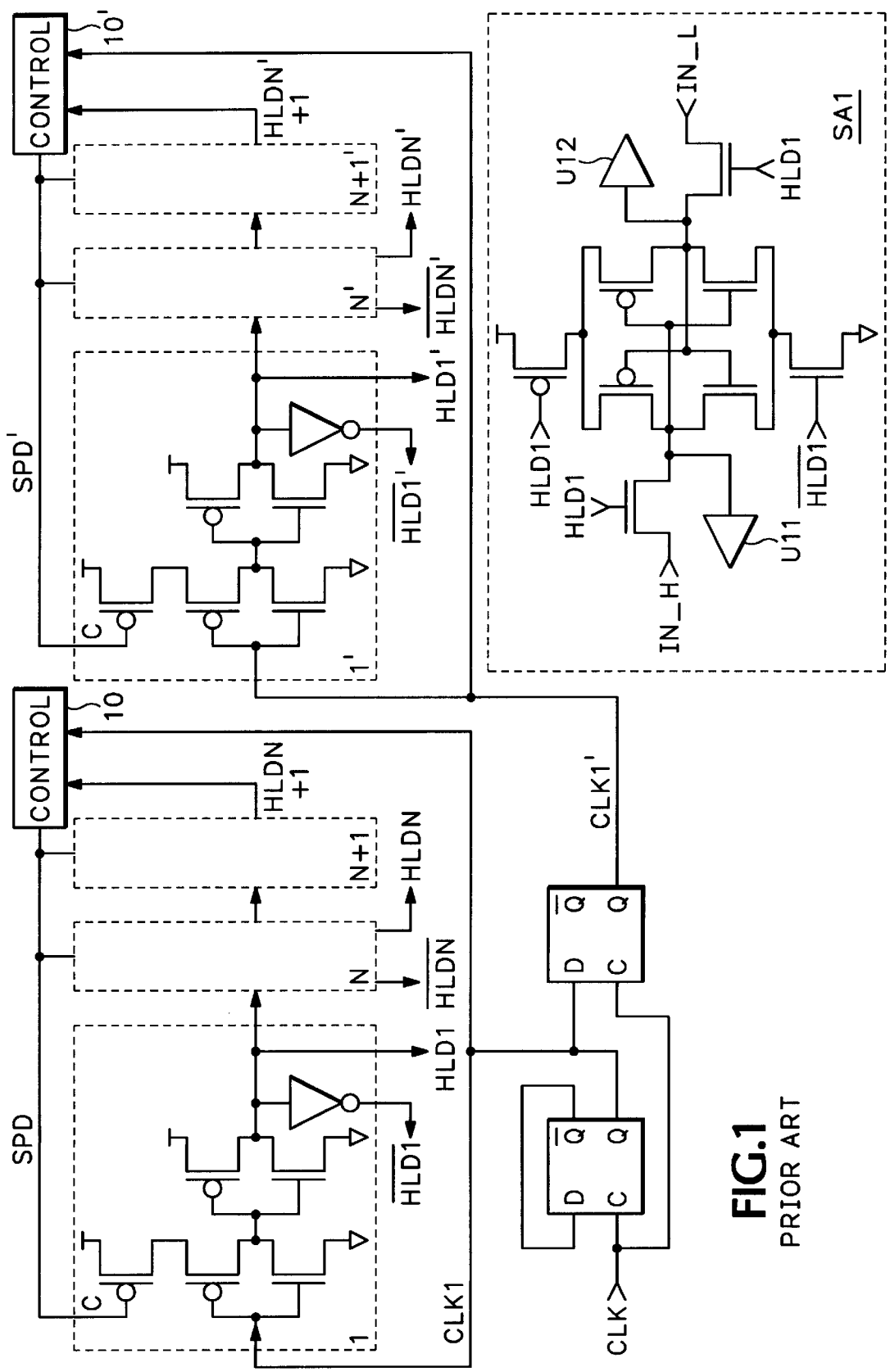
FIG. 1 shows a two delay line implementation of an acquisition system as known from the prior art.

Referring to FIG. 1, a first delay line comprising a first chain of phase shifter circuits 1, ... N, N+1 is controlled by a control circuit 10 in response to the timing difference between an input clock signal (CLK1) and the output clock signal (HLDN+1) of the last phase shifter (N+1) in the chain. Control circuit 10 provides a feedback signal SPD which controls one edge of the clock signals (for example, the falling edge), as they propagate through the delay line. Control signal SPD is applied to the phase shifters at a control input terminal C.

FIG. 1 also shows a second delay line comprising a second chain of phase shifter circuits 1', ... N', N'+1, controlled by a control circuit 10' in response to the timing difference between an input clock signal (CLK1') and the output clock signal (HLDN'+1) of the last phase shifter (N'+1) in the chain. Control circuit 10' provides a feedback signal SPD' which controls one edge of the clock signals (for example, the falling edge), as they propagate through the second delay line. Control signal SPD' is applied to the phase shifters at a control input terminal C.

Complementary Track-and-Hold signals HLD1 and HLD1-BAR ... HLDN and HLDN-BAR, HLDN+1 and HLDN+1 Bar are tapped from the delay line at the output of respective phase shifters. These signals used to control respective different sampling cells which an input signal (IN_H and IN_L) presented in differential form.

Such a sampling cell is shown in FIG. 1 and labeled SA1. U11 of SA1 serves no function other than presenting a symmetrical load to the sampling cell. The output is taken from U12 for processing. The sampling cell tracks the input signal on a high level of control signal HLD1 and holds the sample on a low level of control signal HLD1.

Figure 2:
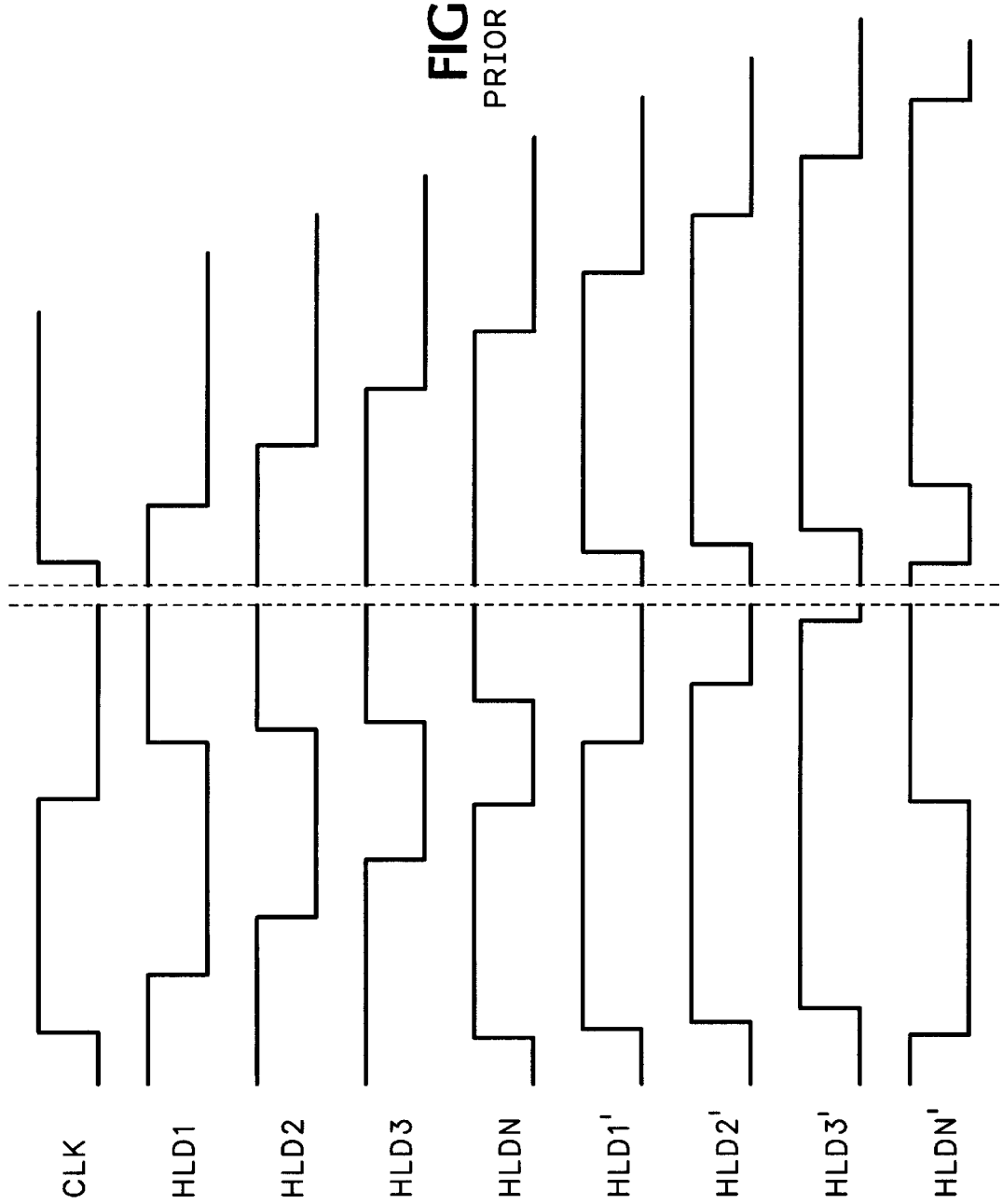
FIG. 2 shows a timing diagram showing the alignment of only one edge of the clock signal as known from the prior art arrangement of FIG. 1.

FIG. 2 illustrates the timing relationship of the HLD signals as they propagate through the delay lines of FIG. 1. Note that the falling edges of each of the control signals are equally spaced within a single clock cycle. Note also that the rising edges do not exhibit this characteristic. The interval between the dotted lines is intended to show that the timing has been adjusted as necessary to move desired edge into the proper position.

Clock signals CLK1 and CLK1' are generated in a complementary clock generation circuit 20 comprising flip-flops 22 and 24, in response to the application of a system clock CLK. Complementary clock generation circuit 20 provides a 50% duty cycle clock CLK1 and its inverse CLK1', even if the system clock CLK is other than a 50% duty cycle.

Figure 3:
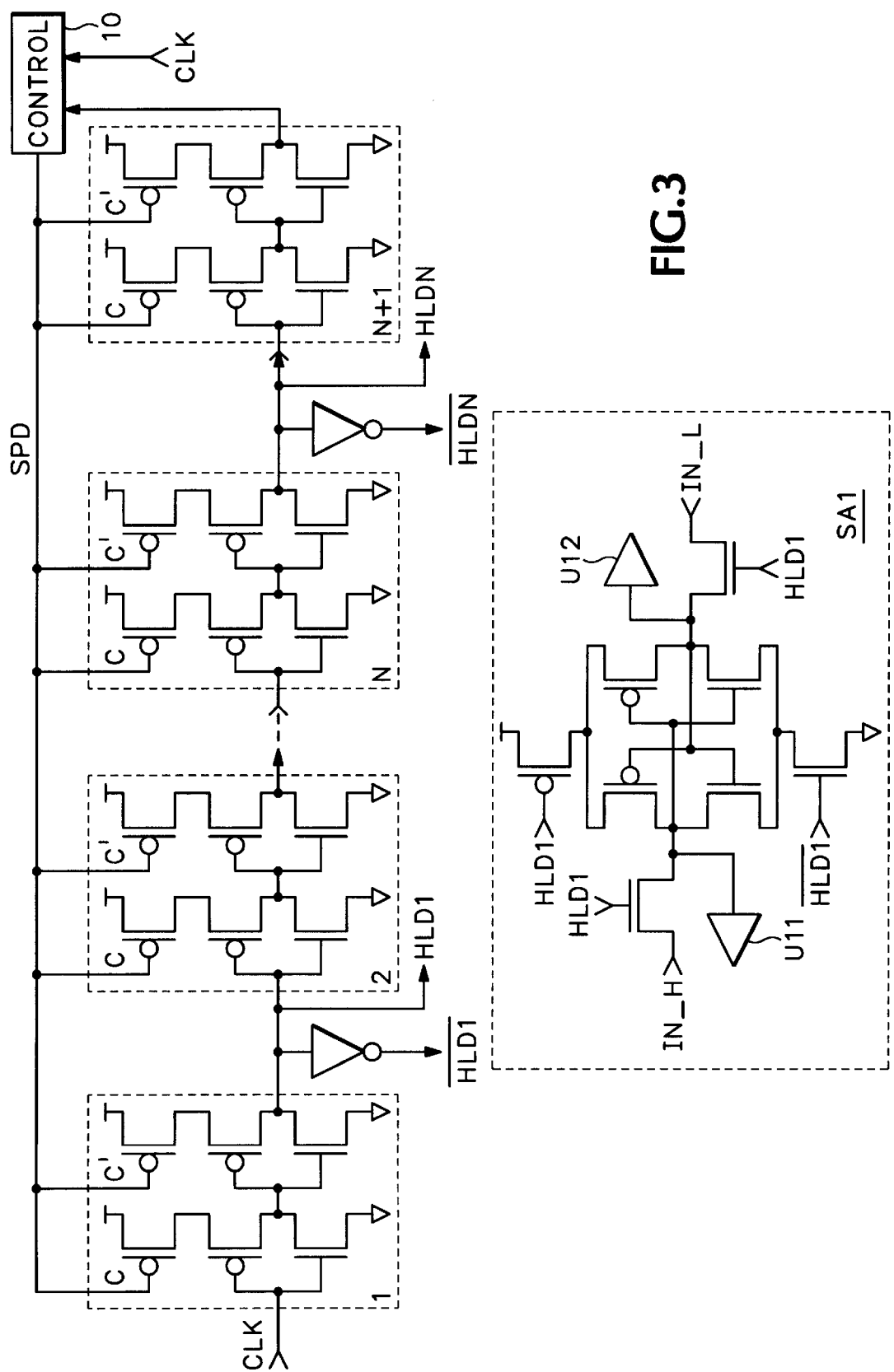
FIG. 3 shows an embodiment of the invention employing a single delay line.

As noted above, the dual delay lines of FIG. 1 are duplicative and therefore are considered somewhat undesirable. A solution to avoid the problem of delay line duplication is shown in FIG. 3. Elements of FIG. 3 bearing the same reference numerals as elements in FIG. 1 have a similar purpose, for example, sampling cell SA1 is identical in both FIG. 1 and FIG. 3.

Referring to FIG. 3, note that there is only a single delay line comprising phase shifting circuits 1 through N+1. Note, however, that the phase shifting circuits of FIG. 3 differ from those of FIG. 1 in that the control signal SPD is applied to both phase shifter inverters through respective top PMOS devices. This important change causes both edges of the HLD control signals to be correctly positioned with respect to the clock signal. Clock signal CLK is defined to be a 50% duty cycle signal.

Figure 4:
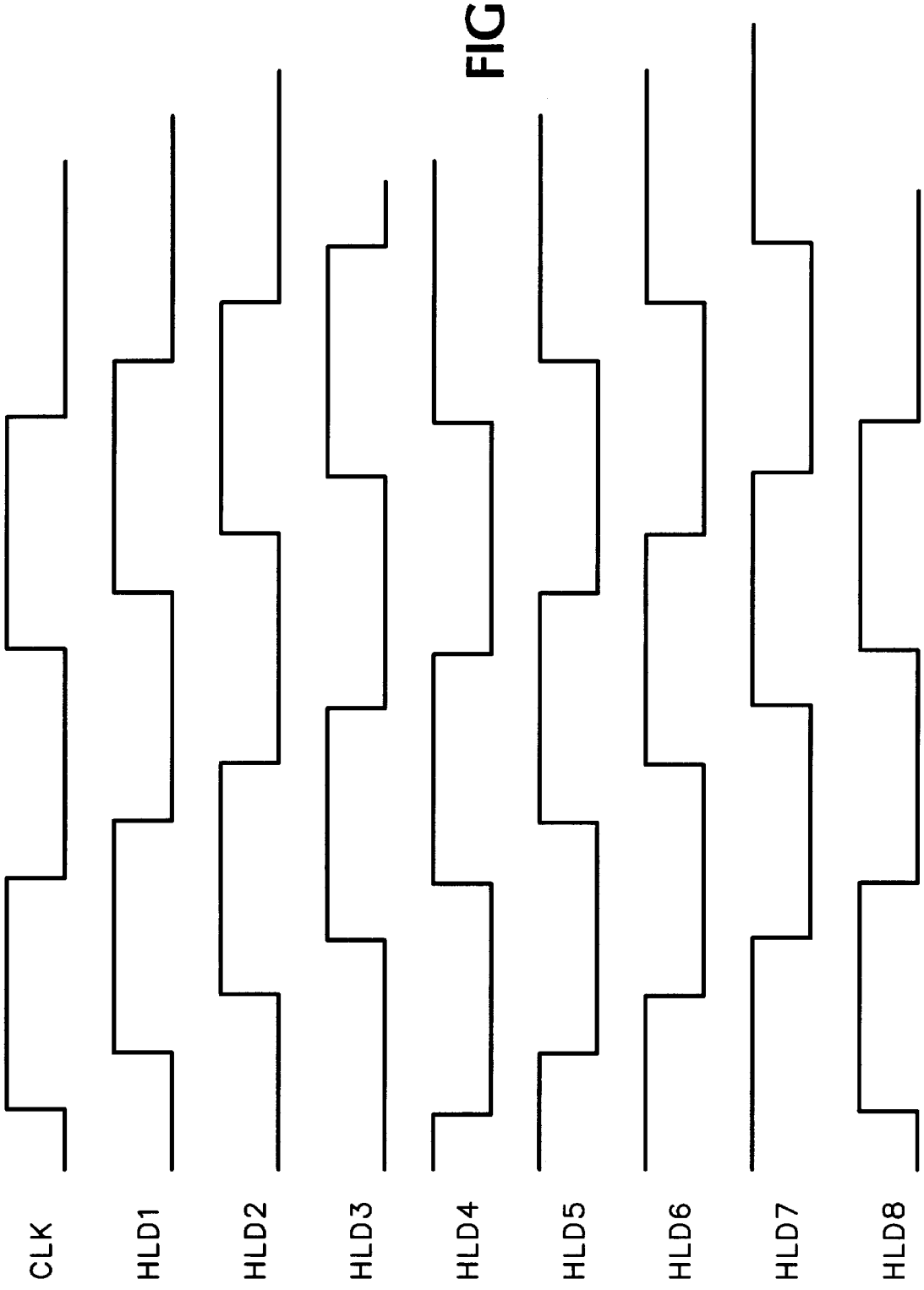
FIG. 4 shows a timing diagram showing the alignment of both edges of the clock signal.

FIG. 4 shows the timing relationship of eight control signals generated in an array of nine phase shifting elements. It is noted that while eight signals are shown for simplicity, a typical value of N (the number of tapped stages) is sixteen, but even sixteen is not a limit. It is important to note from FIG. 4 that both edges of each signal are aligned with respect to the other signals generated in the delay line. The control of the second edge allows the continuous use of the delay chain without allowing for precharge intervals, eliminates the problem of 'holes' thereby eliminates the need for a second delay line operating with complementary timing. An additional advantage of the subject invention is that elimination of the second delay line also reduces the length of the signal line, hence increasing bandwidth.

What is claimed is:

1. A logic analyzer data acquisition circuit, comprising:
   a sampling cell for sampling an input signal in response to a control signal;
   a delay line for receiving an input clock signal and delaying said input clock signal to produce said control signal; and
   a control circuit for comparing a time difference between a delayed clock signal and said input clock signal, and generating a correction signal in response to said difference;
   said delay line comprising a series of delay elements, and each of said series of delay elements having a control input for receiving said correction signal, and correcting both edges of said control signal to a predetermined timing relationship with respect to said input clock signal;
   wherein said delay elements are phase shifter circuits, and said correction signal causes an output signal of a final phase shifter of said delay line to align with said input clock signal.

2. A data acquisition circuit, comprising:
   a sampling cell for sampling an input signal in response to a control signal;
   a delay line for receiving an input clock signal and delaying said input clock signal to produce said control signal; and
   a control circuit for comparing a time difference between a delayed clock signal and said input clock signal, and generating a correction signal in response to said difference;
   said delay line comprising a series of delay elements, and each of said series of delay elements having a control input for receiving said correction signal, and correcting both edges of said control signal to a predetermined timing relationship with respect to said input clock signal;
   wherein said delay elements are phase shifter circuits, and said correction signal causes an output signal of a final phase shifter of said delay line to align with said input clock signal.

3. A data acquisition circuit, comprising:
   a sampling cell for sampling an input signal in response to a control signal;
   a delay line for receiving an input clock signal and delaying said input clock signal to produce said control signal; and
   a control circuit for comparing a time difference between a delayed clock signal and said input clock signal, and generating a correction signal in response to said difference;
   said delay line comprising a series of delay elements, and each of said series of delay elements having a control input for receiving said correction signal, and correcting both edges of said control signal to a predetermined timing relationship with respect to said input clock signal;
   wherein said delay elements are phase shifter circuits, and said correction signal causes an output signal of a final phase shifter of said delay line to align with said input clock signal.

4. The data acquisition system of claim 3, wherein said clock signal exhibits a substantially 50% duty cycle.

* * * * *